(12) United States Patent
Uhara

(10) Patent No.: US 7,452,610 B2
(45) Date of Patent: Nov. 18, 2008

(54) MULTI-LAYER POLYIMIDE FILMS AND FLEXIBLE CIRCUIT SUBSTRATES THEREFROM

(75) Inventor: Kenji Uhara, Aich (JP)

(73) Assignee: Du Pont Toray Company Limited, Tokyo (JP)

(*) Notice: Subject to any disclaimer, the term of this patent is extended or adjusted under 35 U.S.C. 154(b) by 573 days.

(21) Appl. No.: 11/170,224

(22) Filed: Jun. 29, 2005

(65) Prior Publication Data

US 2007/0003773 A1    Jan. 4, 2007

(51) Int. Cl.
*B32B 15/08* (2006.01)
*B32B 27/00* (2006.01)

(52) U.S. Cl. .................. 428/458; 428/473.5

(58) Field of Classification Search .............. 428/458, 428/473.5
See application file for complete search history.

(56) References Cited

U.S. PATENT DOCUMENTS

| | | | |
|---|---|---|---|
| 4,886,874 A | 12/1989 | Nagano et al. | |
| 5,081,229 A | 1/1992 | Akahori et al. | |
| 5,411,765 A | 5/1995 | Kanakarajan et al. | |
| 5,478,914 A | 12/1995 | Kaneko et al. | |
| 5,494,991 A | 2/1996 | Kaneko et al. | |
| 5,858,274 A | 1/1999 | Mishina et al. | |
| 5,954,999 A | 9/1999 | Mishina et al. | |
| 6,139,917 A | 10/2000 | Sano et al. | |
| 6,372,859 B1 | 4/2002 | Sakata et al. | |
| 6,379,784 B1 | 4/2002 | Yamamoto et al. | |
| 6,441,127 B1 | 8/2002 | Sawahata et al. | |
| 6,524,770 B1 | 2/2003 | Hidaka et al. | |
| 6,589,662 B1 * | 7/2003 | Itatani et al. | 428/473.5 |
| 6,908,685 B2 | 6/2005 | Uhara et al. | |
| 2004/0110015 A1 | 6/2004 | Narui et al. | |
| 2004/0185388 A1 | 9/2004 | Hirai | |

FOREIGN PATENT DOCUMENTS

| | | |
|---|---|---|
| JP | 4-261466 | 9/1992 |
| JP | 6-336533 | 12/1994 |
| JP | 8-41227 | 2/1996 |
| JP | 2003 27014 | 1/2003 |
| JP | 2003 191412 A | 7/2003 |

\* cited by examiner

*Primary Examiner*—Ana L Woodward

(57) ABSTRACT

A multi-layer polyimide film including two or more laminated polyimide film layers is provided, with at least one of the two or more polyimide film layers is obtained by imidizing a polyamic acid derived from the reaction of at least one aromatic diamine containing 1-100 mol percent of carboxy-4,4'-diaminobiphenyl represented by the following formula,

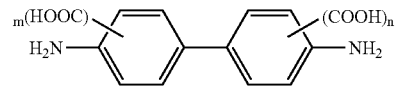

wherein m and n represent integers of 4 or less, including 0, and (m+n) is an integer of 1 or greater, and at least one aromatic tetracarboxylic dianhydride or a derivative thereof. Methods for obtaining a multi-layer polyimide film laminate can exhibit a peel strength of 10N/cm when laminated to a metal foil using an adhesive and can have a water absorption value of less than 3.0 weight percent.

20 Claims, No Drawings

MULTI-LAYER POLYIMIDE FILMS AND FLEXIBLE CIRCUIT SUBSTRATES THEREFROM

FIELD OF THE INVENTION

The present invention relates generally to multi-layer polyimide substrates, and more specifically, to multi-layer polyimide substrates useful in making electronic circuits, having at least one metal layer.

BACKGROUND INFORMATION

Polyimide films have been widely used as a base film for flexible circuit substrates. Oftentimes, these films are used with other polyimide films (and metal foils) to form multi-layer polyimide film laminates bonded to metal.

However polyimide films, in many cases, may not have sufficient peel strength (even when an adhesive is used) and can sometimes peel away from a metal foil causing a long-term reliability problem. To improve this drawback, various electrical, physical, or chemical treatments have been attempted to improve the surface of the polyimide. However, those treatments can also have problems such as using caustic (or very acidic) reagents, adding processing time, and increasing labor requirements.

As one method for improving the adhesive strength of a polyimide film, plasma processing (of the film's surface) is disclosed in Japanese Kokai Patent No. Hei 8[1996]-41227. But in this case, the problem remains that an extra processing step is required to employ the plasma treatment process.

In addition, coating polyimide films with a silane coupling agent (as is disclosed in Japanese Kokai Patent No. Hei 6[1994]-336533) is also known. But in this case there are problems. Here, the adhesive strength can sometimes be lowered because the silane coupling agent can decompose during subsequent heat treatment steps used to convert the polyamic acid to a polyimide.

Furthermore, polyimide films containing tin compounds, and having an excellent adhesion property (as in Japanese Kokai Patent No. Hei 4[1992]-261466) are also known. But, the peel strength of these polyimide films can be about 10 N/cm or less, which may not be good enough in many applications.

Finally, thermoplastic polyimides having good adhesion properties (as in Japanese Kokai Patent No. 2003-27014) are known. But, there can be drawbacks in that these polyimides can 'sink' during soldering due to the polyimide's thermoplasticity.

As such, there remains a need for polyimide films in general (and methods for making same) to have sufficient peel strength when adhered to a metal substrate. There remains a need to accomplish this at low cost without requiring chemical reagents to be used, additional time and labor.

SUMMARY OF THE INVENTION

In one embodiment, a multi-layer polyimide film laminate includes two or more polyimide layers, with at least one of the two or more polyimide layers obtained by imidizing a polyamic acid obtained from the reaction of at least one aromatic diamine containing 1-100 mol percent of carboxy-4,4'-diaminobiphenyl of Formula I (Formula 1)

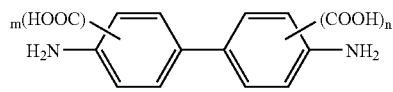

wherein m and n represent integers of 4 or less, including 0, and (m+n) is an integer of 1 or greater, and at least one aromatic tetracarboxylic dianhydride or a derivative thereof.

In another embodiment, a method for obtaining a multi-layer polyimide film laminate includes the steps of providing a polyimide film; coating onto at least one side of a polyimide film a polyamic acid obtained from the reaction of at least one aromatic diamine containing 1-100 mol percent of carboxy-4,4'-diaminobiphenyl of Formula I and at least one aromatic tetracarboxylic dianhydride or a derivative thereof; and, imidizing the polyamic acid coated on the at least one side of the polyimide film to form a polyimide layer of the multi-layer polyimide film laminate.

DETAILED DESCRIPTION OF THE PREFERRED EMBODIMENT(S)

In one embodiment, a multi-layer polyimide film laminate comprises two or more laminated polyimide film layers, with at least one of the two or more polyimide film layers obtained by imidizing a polyamic acid obtained from the reaction of at least one aromatic diamine containing 1-100 mol percent of carboxy-4,4'-diaminobiphenyl of Formula 1

(Formula 1)

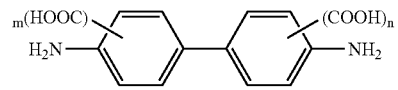

wherein m and n represent integers of 4 or less, including 0, and (m+n) is an integer of 1 or greater, and at least one aromatic tetracarboxylic dianhydride or a derivative thereof. At least one of the two or more polyimide film layers can be represented by the structural units shown in Formula 3

(Formula 3)

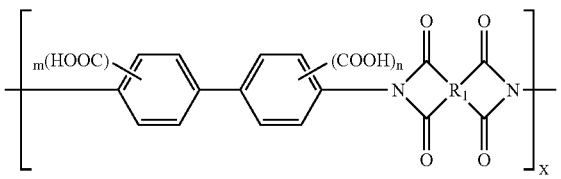

and of Formula 4

(Formula 4)

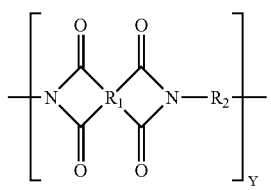

wherein $R_1$ represents a group expressed by the following general Formula 5

(Formula 5)

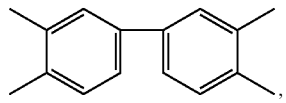

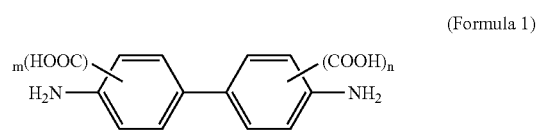

wherein m and n represent integers of 4 or less, including 0, and (m+n) is an integer of 1 or greater, and at least one aromatic tetracarboxylic dianhydride or a derivative thereof. The polyamic acid coating is then imidized to form the multi-layer polyimide film laminate. The polyimide coating layer has structural units of Formula 3

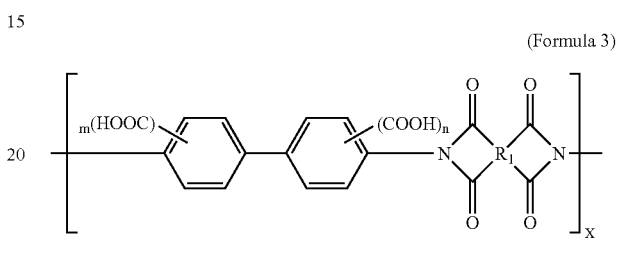

and of Formula 4

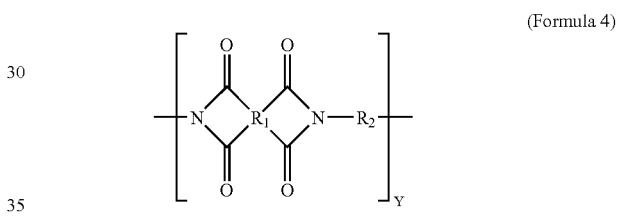

wherein $R_1$ represents a group expressed by the following general Formula 5

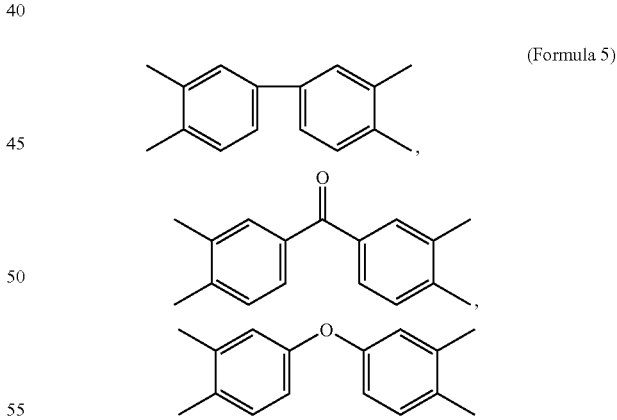

and wherein $R_2$ represents a group expressed by the following general formula 6

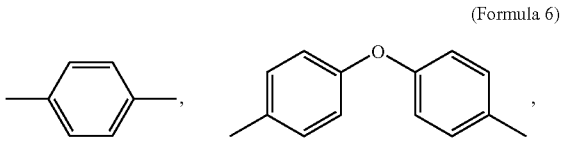

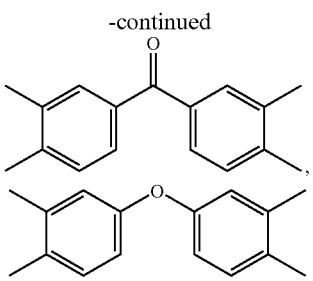

and wherein $R_2$ represents a group expressed by the following general Formula 6

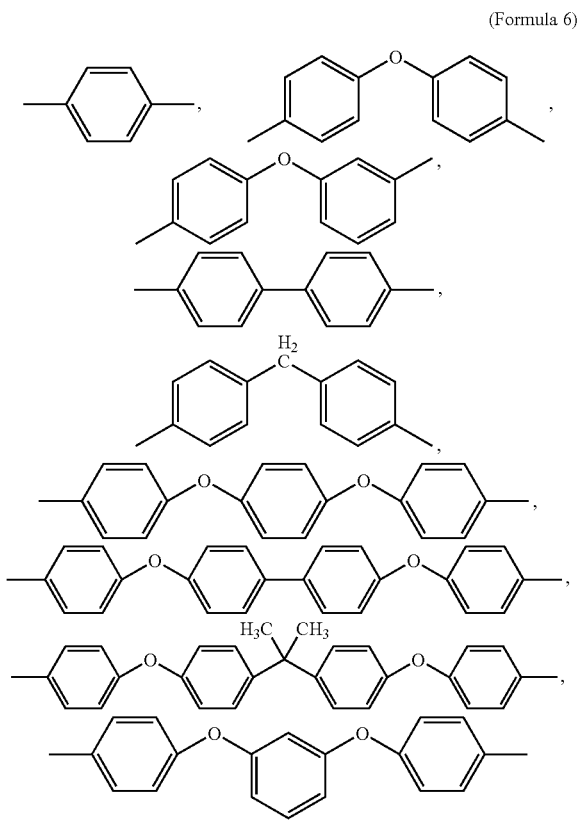

and wherein the mole ratio of X:Y is 1:99 to about 100:0.

At least one aromatic diamine can also comprise either 2,6'-dicarboxy-4,4'-diaminophenyl, 3,3'-dicarboxy-4,4'-diaminophenyl, or a combination of the two. The polyamic acid may be imidized thermally or chemically to form the polyimide. The multi-layer polyimide film laminate can also exhibit low water absorption of about 3.0 weight percent or less. The multi-layer polyimide film laminate may be bonded to a copper foil (either with an adhesive or without) to form a flexible circuit substrate having a peel strength of at least 10 N/cm or greater. The flexible circuit substrate can also be obtained by press bonding a metal foil to the multi-layer polyimide film laminate using an adhesive.

A method for obtaining the multi-layer polyimide film laminate of the present invention comprises the steps of obtaining any suitable polyimide film and coating that film, onto at least one side, a polyamic acid obtained from the reaction of at least one aromatic diamine containing 1-100 mol percent of carboxy-4,4'-diaminobiphenyl of Formula 1

-continued

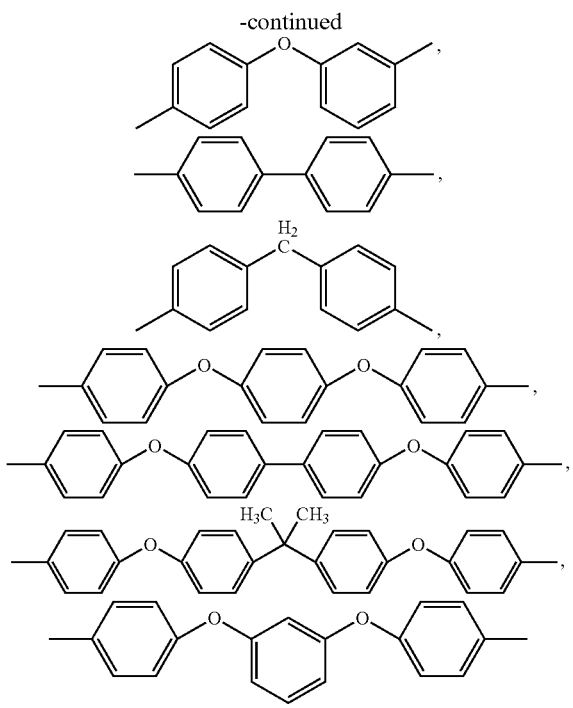

and wherein the molar ratio of X:Y is 1:99 to about 100:0.

The above method can further comprise bonding the multi-layer polyimide film laminate to a copper foil either with an adhesive (or without an adhesive) to form a flexible circuit material exhibiting a peel strength of at least 10 N/cm. The polyimide film laminate exhibits water absorption of 3.0 weight percent or less. A flexible circuit substrate may be obtained by press bonding a metal foil to the polyimide film laminate using an adhesive. The flexible circuit substrate exhibits a peel strength of at least 10 N/cm and a water absorption of 3.0 weight percent or less.

A method for obtaining a multi-layer polyimide film laminate comprises the steps of providing a polyamic acid film; coating onto at least one side of the polyamic acid film a polyamic acid solution comprising at least one aromatic diamine containing 1-100 mol percent of carboxy-4,4'-diaminobiphenyl of Formula I

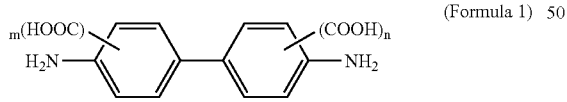
(Formula 1)

wherein m and n represent integers of 4 or less, including 0, and (m+n) is an integer of 1 or greater, and at least one aromatic tetracarboxylic dianhydride or a derivative thereof; and imidizing the polyamic acid solution and polyamic acid film to form a multi-layer polyimide film laminate. The method further comprises bonding the multi-layer polyimide film laminate to a copper foil with an adhesive, which film exhibits a peel strength of at least 10 N/cm. The polyimide film laminate exhibits water absorption of 3.0 weight percent or less. A flexible circuit substrate may be obtained by press bonding a metal foil to the film laminate using an adhesive. The flexible circuit substrate can exhibit a peel strength of at least 10 N/cm or more and can have a water absorption property of 3.0 weight percent or less.

In the present invention, a multi-layer polyimide film laminate is obtained, wherein the laminate can have extremely high peel strength (with a metal foil) and which can maintain low water absorption properties (even when the multi-layer polyimide film laminate is adhered to metal foil using an adhesive). The present invention provides a method of producing a high-quality, high-peel-strength polyimide laminate (and metal substrate) at low cost without requiring harmful reagents, extensive processing time and labor and the like in the treatment for improving the peeling strength of a polyimide film, all of which make these multi-layer polyimide film laminates suitable a base polyimide for mass production of flexible circuit substrates.

In another embodiment of the present invention, a multi-layer polyimide film laminate can be obtained by laminating 2 or more already existing polyimide films where at least one of the polyimide films is derived from a polyamic acid synthesized from an aromatic diamine containing 1-100 mol % carboxy-4,4'-diaminobiphenyl expressed by general formula (1) shown below and an aromatic tetracarboxylic dianhydride or its derivative.

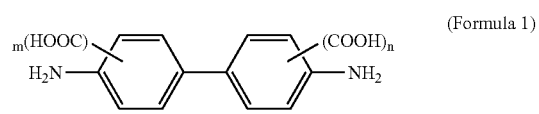
(Formula 1)

Here, the polyimide containing the above mentioned polyamic acid can be positioned in the middle of the laminate, used to bond other polyimide films to it, or can be positioned on an outer surface of the laminate so that the laminate can be bonded to other substrates, such as metal foils.

In another embodiment of the present invention, the multi-layer polyimide films laminates comprise a polyimide layer derived from carboxy-4,4'-diaminobiphenyl where this diamines is 2,6'-dicarboxy-4,4'-diaminophenyl, 3,3'-dicarboxy-4,4'-diaminobiphenyl (or a combination of the two) and where these diamines can be expressed by general formula (2) below,

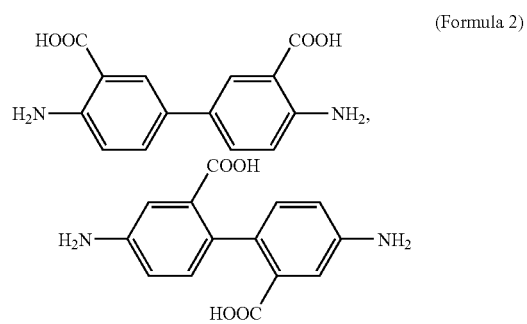
(Formula 2)

In yet another embodiment of the present invention, the multi-layer polyimide laminate may be bonded to a copper foil by means of thermo-compression using an adhesive. Here, the peel strength, measured by the method described below, can be 10 N/cm or greater. Peel strength in general is the strength required to pull apart a polyimide film and a copper foil (e.g. having a thickness of about 35 μm, BAC-13-T, Japan Energy Co.). These two materials are typically bonded together using thermo-compression at 180° C. and 4.4×10⁷ Pa pressure for about 60 minutes where Pyralux® R, LF-0100 (made by E. I. du Pont de Nemours & Co.) is the adhesive. This method is further illustrated and described in JIS C5016-1994.

In another embodiment, a method for obtaining a multi-layer polyimide film laminate includes the steps of: providing a polyamic acid film; coating onto at least one side of the polyamic acid film a polyamic acid solution comprising at least one aromatic diamine containing 1-100 mol percent of carboxy-4,4'-diaminobiphenyl of Formula I, and at least one aromatic tetracarboxylic dianhydride or a derivative thereof; and imidizing the polyamic acid solution and polyamic acid film to form a multi-layer polyimide film laminate.

Water absorption of a polyimide film is typically measured by the following method. Water absorption is the weight loss at 50-200° C. temperature when a laminated polyimide film is dipped in distilled water for 48 hours. The film is wiped off of excess surface water and then heated from room temperature to about 200° C. (at a heating rate of 10° C./min) and finally evaluated using a thermal weight-loss analysis.

The multi-layer polyimide film laminates of the present invention typically have a high peeling strength of 10 N/cm or greater and typically have a water absorption value of 3.0 wt % or less when press bonded to metal foil using an adhesive. These metal laminates can also maintain their peeling strength, without a large amount of dimensional change, for a long time when it is used as a base film for a flexible circuit substrate. As such, these substrates are known to have excellent long-term reliability.

Generally, the peeling strength of the multi-layer polyimide film laminates of the present invention can be further enhanced by a plasma treatment, electrical treatment (such as a corona treatment), physical treatment, and/or chemical treatment (or combinations of the above) if desired. But, the peeling strength values disclosed above were measured without carrying out any of the above-mentioned treatments. As such, the values disclosed herein accurately reflect the improvements of the present invention over the state of the art.

In the present invention, generally speaking the smaller the water absorption the better. Typically, when the water absorption of the polyimide laminate is greater than 3.0 wt %, the physical dimensions of the polyimide film laminate can changed (i.e. the laminate can warp) when used as a flexible circuit substrate. As such low water absorption values are generally preferred.

In one embodiment of the present invention, the aromatic tetracarboxylic acids used to form the polyamic acids (i.e. the precursors of the polyimide film and multi-layer polyimide film laminates) can be selected from the group comprising pyromellitic acid, 3,3',4,4'-biphenyltetracarboxylic acid, 2,3',4,4'-biphenyltetracarboxylic acid, 3,3',4,4'-benzophenone tetracarboxylic acid, 2,3,6,7-naphthalene dicarboxylic acid, 2,2-bis(3,4-dicarboxyphenyl)ether, pyridine-2,3,5,6-tetracarboxylic acid, and their amide-forming derivatives can be mentioned. Acid anhydrides, or dianhydrides, of the above mentioned aromatic tetracarboxylic acids can also be used for the preparation of polyamic acids of the present invention.

In one embodiment of the present invention, the carboxy-4,4'-diamino-biphenyl, used for forming the polyamic acids (i.e. the precursor of the polyimides of the present invention) can be used in combination with other suitable diamines. These suitable diamines can be selected from the group comprising, p-phenylenediamine, m-phenylenediamine, penthidine, p-xylylenediamine, 4,4'-diaminodiphenyl ether, 3,4'-diaminodiphenyl ether, 4,4'-diaminodiphenylmethane, 4,4'-diaminodiphenylsulfone, 3,3'-dimethyl-4,4'-diaminodiphenylmethane, 1,5-diaminonaphthalene, 3,3'-dimethoxy-penthidine, 1,4-bis(3-methyl-5-aminophenyl) benzene and their amide-forming derivatives can be mentioned.

In another embodiment of the present invention, the carboxyl groups of the aforementioned carboxy-4,4'-diaminobiphenyl can have multiple substitution groups. The substitution position of the carboxyl groups can vary. Examples include, but are not limited to, 2,6'-dicarboxy-4,4'-diaminobiphenyl, 3,3'-dicarboxy-4,4'-diaminobiphenyl, and 2,3'-dicarboxy-4,4'-diaminobiphenyl. Typically, 2,6'-dicarboxy-4,4'-diamino-biphenyl and/or 3,3'-dicarboxy-4,4'-diaminobiphenyl are useful from the viewpoint of simplicity of the synthesis and the fact that these diamines are readily available commercially.

In one embodiment of the present invention the amount of carboxy-4,4'-diaminobiphenyl can be adjusted to a range of about 5-100 mol %.

Organic solvents useful in the preparation of the polyamic acid solutions of the present invention include, but are not limited to, sulfoxide solvents such as dimethyl sulfoxide, diethyl sulfoxide. In addition, formamide solvents such as N,N-dimethyl formamide, N,N-diethyl formamide can be used. Other useful solvents include acetamide solvents such as N,N-dimethyl acetamide and N,N-diethyl acetamide as well as pyrrolidone solvents such as N-methyl-2-pyrrolidone, N-vinyl-2-pyrrolidone, and phenol solvents such as phenol, o-, m-, or p-cresol, xylenol, halogenated phenol, catechol. Finally, aprotic polar solvents such as hexamethylphosphoramide, γ-butyrolactone and aromatic hydrocarbons such as xylene, toluene can also be used. These solvents can be used alone or as mixtures. In one instance, in the case of the polymerization of 2,6'-dicarboxy-4,4'-diaminophenyl, N-methyl-2-pyrrolidone can be used as it generally has good solubility with this diamine.

In one embodiment of the present invention, the solids content of the polyamic acid in the organic solvent (i.e. the polyamic acid solutions) can be between 5-40 wt %, sometimes 10-30 wt %. In addition, the viscosity the polyamic solution can be in the range of 10-2,000 Pa·s as measured by a Brookfield viscometer, or can be in the range of 100-1,000 Pa·s. Finally, the polyamic acid solutions of the present invention can be partially imidized.

In the present invention, the dianhydride component and diamines component (as constituents of a polyamic acids) are typically polymerized in an almost equimolar amount. However, one component can be added in excess amount, within about 10 mol percent with respect to the other component if desired. In another embodiment, these two components can be mixed in excess (with respect to each other) in an amount within the range of 5 mol percent.

In one embodiment of the present invention, the polymerization reaction (i.e. the chemical reaction forming the polyamic acid) is carried out the in the temperature range of about 0-80° C. for about 10 minutes to about 30 hours under mechanic stirring (and/or mixing) in the presence of an organic solvent. If necessary however, the polymerization reaction may be performed in increments where the temperature may be raised or lowered in any one of a variety of manners.

Generally, there are no specific restrictions on the addition order of dianhydride and diamine components, however if one embodiment the dianhydride component is added to a solution containing the diamine component. Generally speaking, deaeration during the polymerization reaction is an effective method for the preparation of high-quality organic solvent solutions containing polyamic acids. In addition, the polymerization reaction may be controlled by adding a small amount of a terminal blocking agent to the diamine component prior to the polymerization reaction.

In one embodiment of the present invention, a polyamic acid solution is prepared having a viscosity, measured at 25° C. by a rotary viscometer, of about 10-500 Pa·s.

The aforementioned polyamic acid solution is cast on a support to obtain a self-supporting polyamic acid film (with optional heat added to dry some of the solvent). Next, the self-supporting polyamic acid film is physically fixed (along the sides) and heat treated at about 200° C. to 400° C. to form a polyimide.

As herein defined, a "support" means that which has a plane such as glass, metal polymer film, and the like, and that can support the cast polyamic acid when said polyamic acid is cast thereon.

As herein defined, "casting" means that a polyamic acid is spread out on the support. In one instance, a polyamic acid solution is extruded using a bar coater, spin coater, or a pipe-form substance (in an appropriate hollow form) whereby the polyamic acid solution is spread out onto the support.

In the manufacture of the polyimide films (and copolyimide films) of the present invention, the polyimide thus obtained is formed by an imidization-ring closing reaction of the polyamic acid, a chemical ring-closing method by dehydration using (optionally) a dehydration agent and catalyst. When using only heat, a thermal ring-closing method can be employed whereby the dehydration, or a ring closing reaction, is accelerated using only heat.

In the chemical conversion method, a dehydration agent can be an aliphatic acid anhydride such as acetic anhydride (or an acid anhydride such as phthalic anhydride). Other catalysts include, but are not limited to, heterocyclic tertiary amines such as pyridine, picoline, quinoline, and the like, aliphatic tertiary amines such as triethylamine and the like, and tertiary amines such as N,N-dimethylaniline and the like. These can be used alone or in combination with one another.

In one embodiment of the present invention, the polyimide film (and copolyimide film) can have a thickness of about 3-250 μm. If the thickness is less than 3 μm, it can be difficult to maintain the shape of the film. If the thickness exceeds 250 μm, the film can be deficient in bendability and may, in some cases, be unfit for use as a flexible circuit substrate.

Both stretched and unstretched polyimide films can be used in accordance with the present invention. Furthermore, the films of the present invention may contain addition fillers at a weight percent loading of about 10 weight percent or less wherein the filler comprises either an inorganic or organic additives used to improve the processability of the material.

EXAMPLES

Hereinafter, the present invention is explained more concretely by the following examples. The peel strength in the Examples was measured by the following method.

Peel Strength

This is the strength required when a polyimide film and copper foil (thickness 35 μm, BAC-13-T, Japan Energy Co.) are bonded by thermo-compression at 180° C. and $4.4 \times 10^7$ Pa pressure for 60 minutes using Pyralux® R LF-0100, E. I. du Pont de Nemours & Co. adhesive film; the resulting laminate is peeled off by the method described in JIS C5016-1994.

Example 1

In a 300-ml separatory flask provided with a DC stirrer, 3,3'-dicarboxy-4,4'-diaminobiphenyl at 2.11 g (7.7 mmol), 4,4'-diaminodiphenyl ether at 18.01 g (89 mmol), and N,N'-dimethyl acetamide at 148.84 g were added and stirred in a nitrogen atmosphere at room temperature. Furthermore, pyromellitic dianhydride at 20.52 g (94 mmol) was divided and added several times over 30 minutes to 1 hour. After stirring for 1 hour, 11.19 g of N,N'-dimethyl acetamide solution (6 wt %) of pyromellitic dianhydride was added dropwise into it over 30 minutes and further stirred for 1 hour.

The polyamic acid thus obtained, at 100.00 g, was deaerated for 5 minutes using a hybrid mixer of the Kiens Co. A part of the polyamic acid mixture was taken up on Kapton R200H (registered trademark, E. I. du Pont de Nemours & Co.) and formed into a uniform film using an applicator. It was heated at 100° C. for 1 hour, fixed on a metal frame, and heated at 200° C. for 30 minutes, 300° C. for 30 minutes, and 400° C. for 5 minutes to obtain a polyimide film laminate. The peeling strength of the polyimide film laminate was measured; the result is shown in Table 1.

Example 2

In a 300-ml separatory flask provided with a DC stirrer, 3,3'-dicarboxy-4,4'-diaminobiphenyl at 3.91 g (14 mmol), 4,4'-diaminodiphenyl ether at 16.45 g (81 mmol), and N,N'-dimethyl acetamide at 148.96 g were added and stirred in nitrogen atmosphere at room temperature. Furthermore, pyromellitic dianhydride at 20.25 g (93 mmol) was divided and added several times over 30 minutes to 1 hour. After stirring for 1 hour, 11.06 g of an N,N'-dimethyl acetamide solution (6 wt %) of pyromellitic dianhydride was added dropwise into it over 30 minutes and further stirred for 1 hour.

A polyimide film laminate was obtained from the polyamic acid thus obtained by the same method as in Application Example 1. The peeling strength of the polyimide film laminate was measured; the result is shown in Table 1.

Example 3

In a 300-ml separatory flask provided with a DC stirrer, 3,3'-dicarboxy-4,4'-diaminobiphenyl at 6.41 g (24 mmol), 4,4'-diaminodiphenyl ether at 14.28 g (71 mmol), and N,N'-dimethyl acetamide at 149.13 g were added and stirred in a nitrogen atmosphere at room temperature. Furthermore, pyromellitic dianhydride at 19.92 g (91 mmol) was divided and added several times over 30 minutes to 1 hour. After stirring for 1 hour, 10.88 g of an N,N'-dimethyl acetamide solution (6 wt %) of pyromellitic dianhydride was added dropwise over 30 minutes and further stirred for 1 hour.

A polyimide film laminate was obtained from the polyamic acid thus obtained by the same method as in Application Example 1. The peeling strength of the polyimide film laminate was measured; the result is shown in Table 1.

Example 4

In a 300 ml separatory flask provided with a DC stirrer, 2,6'-dicarboxy-dicarboxy-4,4'-diaminobiphenyl at 2.60 g (9.6 mmol), 4,4'-diaminodiphenyl ether at 17.19 g (86 mmol), and N-dimethyl-2-pyrrolidone at 150.78 g were added and stirred in a nitrogen atmosphere at room temperature. Furthermore, pyromellitic dianhydride at 20.19 g (93 mmol) was divided and added several times over 30 minutes to 1 hour. After stirring for 1 hour, 9.65 g of an N-methyl-2-pyrrolidone solution (5 wt %) of pyromellitic dianhydride was added dropwise over 30 minutes and further stirred for 1 hour.

A polyimide film laminate was obtained from the polyamic acid thus obtained by the same method as in Application Example 1. The peeling strength of the polyimide film laminate was measured; the result is shown in Table 1.

Example 5

In a 300 ml separatory flask provided with a DC stirrer, 2,6'-dicarboxy-4,4'-diaminobiphenyl at 5.11 g (19 mmol), 4,4'-diaminodiphenyl ether at 15.02 g (75 mmol), and N-dimethyl-2-pyrrolidone at 149.78 g were added and stirred in a nitrogen atmosphere at room temperature. Furthermore, pyromellitic dianhydride at 19.85 g (91 mmol) was divided and added several times over 30 minutes to 1 hour. After stirring for 1 hour, 9.48 g of an N-methyl-2-pyrrolidone solution (5 wt %) of pyromellitic dianhydride was added dropwise over 30 minutes and further stirred for 1 hour.

A polyimide film laminate was obtained from the polyamic acid thus obtained by the same method as in Application Example 1. The peeling strength of the polyimide film laminate was measured; the result is shown in Table 1.

Comparative Example 1

In a 500-ml separatory flask provided with a DC stirrer, 4,4'-diaminodiphenyl ether at 38.48 g (190 mmol) and N,N'-dimethyl acetamide at 320.00 g were added and stirred in nitrogen atmosphere at room temperature. Furthermore, pyromellitic dianhydride at 40.27 g (185 mmol) was divided and added several times over 30 minutes to 1 hour. After stirring for 1 hour, 22.01 g of an N,N'-dimethyl acetamide solution (6 wt %) of pyromellitic dianhydride was added dropwise over 30 minutes and further stirred for 1 hour.

The polyamic acid thus obtained at 100.00 g was stirred for 5 minutes using a hybrid mixer of the Kiens Co. A part of the polyamic acid mixture was taken up on a polyester film and formed into a uniform film using an applicator. This was heated at 100° C. for 1 hour and peeled off from the polyester film to obtain a self-retaining polyamic acid film. This was heated at 200° C. for 30 minutes, 300° C. for 30 minutes, and 400° C. for 5 minutes to obtain a polyimide film. The peeling strength of the polyimide film was measured; the result is shown in Table 1.

Comparative Example 2

In a 300-ml separatory flask provided with a DC stirrer, 3,3'-dicarboxy-4,4'-diaminobiphenyl at 2.11 g (7.7 mmol), 4,4'-diaminodiphenyl ether at 18.01 g (89 mmol), and N,N'-dimethyl acetamide at 148.84 g were added and stirred in a nitrogen atmosphere at room temperature. Furthermore, pyromellitic dianhydride at 20.52 g (94 mmol) was divided and added several times over 30 minutes to 1 hour. After stirring for 1 hour, 11.19 g of an N,N'-dimethyl acetamide solution (6 wt %) of pyromellitic dianhydride was added dropwise over 30 minutes and further stirred for 1 hour.

A polyimide film was obtained from the polyamic acid thus obtained by the same method as in Comparative Example 1. The peeling strength of the polyimide film was measured; the result is shown in Table 1.

Comparative Example 3

In a 300-ml separatory flask provided with a DC stirrer, 3,3'-dicarboxy-4,4'-diaminobiphenyl at 3.91 g (14 mmol), 4,4'-diaminodiphenyl ether at 16.45 g (81 mmol) and N,N'-dimethyl acetamide at 148.96 g were added and stirred in a nitrogen atmosphere at room temperature. Furthermore, pyromellitic dianhydride at 20.25 g (93 mmol) was divided and added several times over 30 minutes to 1 hour. After stirring for 1 hour, 11.06 g of an N,N'-dimethyl acetamide solution (6 wt %) of pyromellitic dianhydride was added dropwise over 30 minutes and further stirred for 1 hour.

A polyimide film was obtained from the polyamic acid thus obtained by the same method as in Comparative Example 1. The peeling strength of the polyimide film was measured; the result is shown in Table 1.

Comparative Example 4

In a 300-ml separatory flask provided with a DC stirrer, 3,3'-dicarboxy-4,4'-diaminobiphenyl at 6.41 g (24 mmol), 4,4'-diaminodiphenyl ether at 14.28 g (71 mmol) and N,N'-dimethyl acetamide at 149.13 g were added and stirred in a nitrogen atmosphere at room temperature. Furthermore, pyromellitic dianhydride at 19.92 g (91 mmol) was divided and added several times over 30 minutes to 1 hour. After stirring for 1 hour, 10.88 g of an N,N'-dimethyl acetamide solution (6 wt %) of pyromellitic dianhydride was added dropwise over 30 minutes and further stirred for 1 hour.

A polyimide film was obtained from the polyamic acid thus obtained by the same method as in Comparative Example 1. The peeling strength of the polyimide film was measured; the result is shown in Table 1.

Comparative Example 5

In a 300-ml separatory flask provided with a DC stirrer, 2,6'-dicarboxy-4,4'-diaminobiphenyl at 2.60 g (9.6 mmol), 4,4'-diaminodiphenyl ether at 17.19 g (86 mmol), and N-dimethyl-2-pyrrolidone at 150.78 g were added and stirred in a nitrogen atmosphere at room temperature. Furthermore, pyromellitic dianhydride at 20.19 g (93 mmol) was divided and added several times over 30 minutes to 1 hour. After stirring for 1 hour, 9.65 g of an N-methyl-2-pyrrolidone solution (5 wt %) of pyromellitic dianhydride was added dropwise over 30 minutes and further stirred for 1 hour.

A polyimide film was obtained from the polyamic acid thus obtained by the same method as in Comparative Example 1. The peeling strength of the polyimide film was measured; the result is shown in Table 1.

Comparative Example 6

In a 300-ml separatory flask provided with a DC stirrer, 2,6'-dicarboxy-4,4'-diaminobiphenyl at 5.11 g (19 mmol), 4,4'-diaminodiphenyl ether at 15.02 g (75 mmol), and N-dimethyl-2-pyrrolidone at 149.78 g were added and stirred in a nitrogen atmosphere at room temperature. Furthermore, pyromellitic dianhydride at 19.85 g (91 mmol) was divided and added several times over 30 minutes to 1 hour. After stirring for 1 hour, 9.48 g of an N-methyl-2-pyrrolidone solution (5 wt %) of pyromellitic dianhydride was added dropwise over 30 minutes and further stirred for 1 hour.

A polyimide film was obtained from the polyamic acid thus obtained by the same method as in Comparative Example 1. The peeling strength of the polyimide film was measured; the result is shown in Table 1.

TABLE 1

|  | Film thickness (μm) | Peeling strength (N/cm) | Water absorption (Wt %) |
|---|---|---|---|
| Example 1 | 61 | 10.7 | 2.4 |
| Example 2 | 63 | 11.3 | 2.4 |

TABLE 1-continued

| | Film thickness (μm) | Peeling strength (N/cm) | Water absorption (Wt %) |
|---|---|---|---|
| Example 3 | 64 | 11.7 | 2.5 |
| Example 4 | 67 | 12.0 | 2.5 |
| Example 5 | 62 | 23.4 | 2.4 |
| Comparative Example 1 | 65 | 1.9 | 2.7 |
| Comparative Example 2 | 62 | 10.6 | 3.2 |
| Comparative Example 3 | 58 | 11.1 | 3.4 |
| Comparative Example 4 | 57 | 11.8 | 3.6 |
| Comparative Example 5 | 62 | 12.2 | 3.5 |
| Comparative Example 6 | 65 | 23.2 | 3.8 |

As is clear from the results in Table 1, in the polyimide film laminates of the present invention (Examples 1-5), the adhesive force is notably improved without increasing the water absorption as compared with polyimide films of Comparative Examples 1-6.

What is claimed is:

1. A multi-layer polyimide film, comprising:
two or more polyimide film layers, with at least one of the two or more polyimide film layers obtained by imidizing a polyamic acid obtained from the reaction of at least one aromatic diamine containing 1-100 mol percent of carboxy-4,4'-diaminobiphenyl of Formula 1:

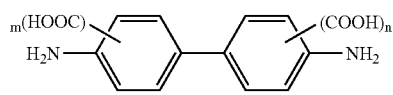
(Formula 1)

wherein m and n represent integers of 4 or less, including 0, and (m+n) is an integer of 1 or greater, and at least one aromatic tetracarboxylic dianhydride or a derivative thereof.

2. The film according to claim 1 wherein the at least one of the two or more polyimide film layers has structural units of Formula 3 and optionally 4:

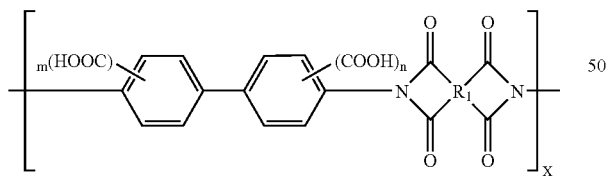
(Formula 3)

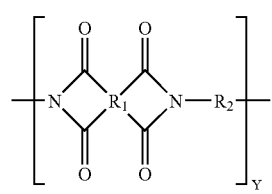
(Formula 4)

wherein m and n represent integers of 4 or less, including 0, and (m+n) is an integer of 1 or greater,
wherein $R_1$ represents a group expressed by the following Formula 5,

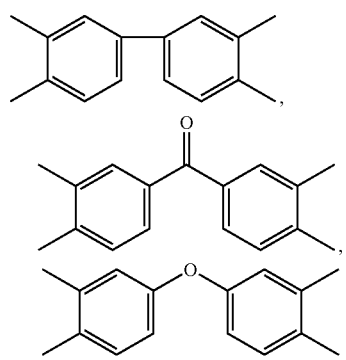
(Formula 5)

and wherein $R_2$ represents a group expressed by the following formula 6,

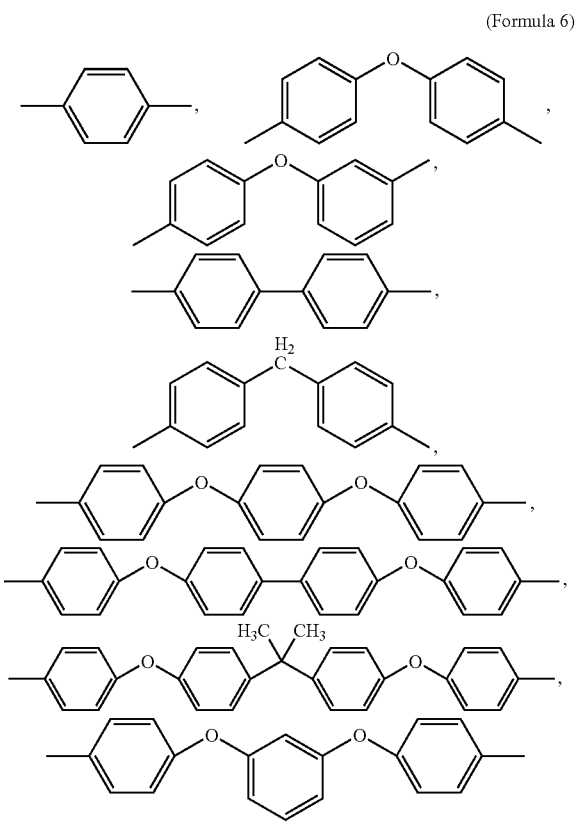
(Formula 6)

and wherein the molar ratio of X:Y is from 1:99 to 100:0.

3. The film according to claim 1, wherein the at least one aromatic diamine comprises 2,6'-dicarboxy-4,4'-diaminophenyl.

4. The film according to claim 1, wherein the at least one aromatic diamine comprises 3,3'-dicarboxy-4,4'-diaminophenyl.

5. The film according to claim 1, wherein the polyamic acid is imidized thermally or chemically.

6. The film according to claim 1 wherein the film laminate is bonded to a copper foil using an adhesive forming a flexible circuit substrate where substrate exhibits a peel strength of at least 10 N/cm.

7. The film according to claim 1, where the laminate has a water absorption value of less than 3.0 weight percent.

8. A flexible circuit substrate obtained by press bonding a metal foil to the film laminate according to claim 1.

9. The flexible circuit substrate according to claim 8, wherein the substrate has a peel strength of at least 10 N/cm and has a water absorption value of less than 3.0 weight percent.

10. A method for obtaining a multi-layer polyimide film laminate, comprising the steps of:
    providing a polyimide film;
    coating onto at least one side of the polyimide film a polyamic acid obtained from the reaction of at least one aromatic diamine containing 1-100 mol percent of carboxy-4,4'-diaminobiphenyl of Formula 1

(Formula 1)

$m(HOOC)$ — ... — $(COOH)_n$, $H_2N$ — ... — $NH_2$ wherein m and n represent integers of 4 or less, including 0, and (m+n) is an integer of 1 or greater, and at least one aromatic tetracarboxylic dianhydride or a derivative thereof; and, imidizing the polyamic acid to form a coated polyimide film wherein the coated polyimide film and the polyimide film form a multi-layer polyimide film laminate.

11. The method according to claim 10, wherein the coated polyimide film is represented by the Formulas 3 and optionally 4:

(Formula 3)

(Formula 4)

wherein m and n represent integers of 4 or less, including 0, and (m+n) is an integer of 1 or greater, wherein $R_1$ represents a group expressed by the following Formula 5, (Formula 5)

and wherein $R_2$ represents a group expressed by the following Formula 6, (Formula 6)

and wherein the molar ratio of X:Y is 1:99 to 100:0.

12. The method according to claim 10, further comprising the step of bonding the polyimide film laminate to a copper foil using an adhesive to form a flexible circuit substrate wherein the substrate has a peel strength of at least 10 N/cm.

13. The method according to claim 10, wherein the polyimide film laminate has a water absorption value of less than 3.0 weight percent.

14. A flexible circuit substrate obtained by press bonding a metal foil to the polyimide film laminate according to claim 10 using an adhesive.

15. The flexible circuit substrate according to claim 14, which wherein the peel strength of the substrate is at least 10 N/cm and wherein the water absorption value of multi-layer polyimide laminate is less than 3.0 weight percent.

16. A method for obtaining a multi-layer polyimide film laminate, comprising the steps of:

providing a polyamic acid film;
coating onto at least one side of the polyamic acid film a polyamic acid solution comprising at least one aromatic diamine containing 1-100 mol percent of carboxy-4,4'-diaminobiphenyl of Formula 1

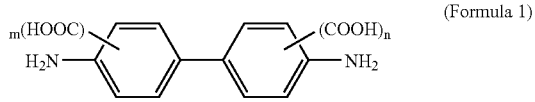
(Formula 1)

wherein m and n represent integers of 4 or less, including 0, and (m+n) is an integer of 1 or greater, and at least one aromatic tetracarboxylic dianhydride or a derivative thereof; and imidizing the polyamic acid solution and polyamic acid film to form a multi-layer polyimide film laminate.

17. The method according to claim 16, further comprising the step of bonding the multi-layer polyimide film laminate to a copper foil with an adhesive to form a flexible circuit substrate wherein the substrate has a peel strength of at least 10 N/cm.

18. The method according to claim 16, wherein the polyimide film laminate has a water absorption value of less than 3.0 weight percent.

19. A flexible circuit substrate obtained by press bonding a metal foil to the film laminate according to claim 16 using an adhesive.

20. The flexible circuit substrate according to claim 19, wherein the substrate has a peel strength of at least 10 N/cm and wherein the laminate has a water absorption value of less than of 3.0 weight percent.

* * * * *